(12) United States Patent
Pioppo et al.

(10) Patent No.: US 6,194,935 B1
(45) Date of Patent: Feb. 27, 2001

(54) CIRCUIT AND METHOD FOR CONTROLLING THE SLEW RATE OF THE OUTPUT OF A DRIVER IN A PUSH-PULL CONFIGURATION

(75) Inventors: Sergio Franco Pioppo, Mascalucia; Ignazio Cala', Palermo, both of (IT)

(73) Assignee: STMicroelectronics S.r.l., Agrate Brianza (MI) (IT)

( * ) Notice: Subject to any disclaimer, the term of this patent is extended or adjusted under 35 U.S.C. 154(b) by 0 days.

(21) Appl. No.: 09/436,570

(22) Filed: Nov. 9, 1999

(51) Int. Cl.$^7$ ..................................................... H03K 5/12
(52) U.S. Cl. ........................ 327/170; 327/103; 327/134; 327/540; 327/543
(58) Field of Search ..................................... 327/100, 103, 327/112, 131, 134, 170, 337, 538, 539, 540, 541, 542, 543; 323/312, 315, 316; 326/82, 87

(56) References Cited

U.S. PATENT DOCUMENTS

| 5,387,882 | * | 2/1995 | Schoofs | 327/77 |
| 5,736,888 | | 4/1998 | Sharpe-Geisler | 327/382 |
| 5,742,193 | * | 4/1998 | Colli et al. | 327/170 |
| 5,754,078 | * | 5/1998 | Tamagawa | 330/255 |
| 5,828,245 | | 10/1998 | Brambilla et al. | 327/108 |

FOREIGN PATENT DOCUMENTS 0457595  11/1991  (EP).
0492506   7/1992  (EP).

OTHER PUBLICATIONS

EPO Form 1507.0 dated Apr. 20, 1999 for European Application No. 98830679.1.

* cited by examiner

Primary Examiner—Timothy P. Callahan
Assistant Examiner—An T. Luu

(57) ABSTRACT

A circuit and method are disclosed for controlling the slew rate of the output voltage of a driver in a push-pull configuration. The circuit includes a capacitive element and a current generator circuit for generating one or more currents. The circuit further includes a switching circuit for selectively charging and discharging the capacitive element in response to an input signal, wherein the voltage across the capacitive element is a voltage signal whose edge transitions have slopes which are controlled based upon the capacitance of the capacitive element and the current level of the one or more currents. The circuit further includes a conversion circuit for converting the voltage signal into one or more current signals, the one or more current signals being used to control a pull-up device and pull-down device of the driver so that the slopes of the edge transitions of the output voltage thereof is based upon the slopes of the edge transitions of the voltage signal appearing across the capacitive element.

24 Claims, 3 Drawing Sheets

CIRCUIT AND METHOD FOR CONTROLLING THE SLEW RATE OF THE OUTPUT OF A DRIVER IN A PUSH-PULL CONFIGURATION

BACKGROUND OF THE INVENTION

1. Field of Invention

The present invention relates to a circuit for controlling the slew rate of the output voltage of a driver in a push-pull configuration.

2. Background of the Relevant Art

It is important to be able to control the slew rate of the output signal of a driver so that the edge transitions of the output signal are neither too fast nor too slow, in order to ensure accurate control of the output waveform as the load connected to the driver varies.

In particular, for RS232 serial interfaces, for example, the load is of the ohmic-capacitive type.

When operating at data rates on the order of 100 kbps, it is important to be able to precisely control the slew rate of the output signal of the driver in order to ensure a desired data transmission rate.

A known solution for controlling the slew rate of the output signal of a driver is shown in FIG. 1, wherein the input signal Tin of the driver is input to a first positive boost circuit 1, which boosts the signal Tin to the voltage V+ obtained from a charge pump circuit, and is also input to a second negative boost circuit 2, which pulls the level of the signal Tin down to the level V− by inverting the voltage obtained from the charge pump circuit.

Two capacitors C1 and C2 are respectfully connected between the output signal Tout of the driver and gate terminals of a PMOS transistor P1 and of an NMOS transistor N1. The gate or control electrode of transistors P1 and N1 are respectively connected to the output of positive boost circuit 1 and negative boost circuit 2. Transistors P1 and N1 form the final stage of the known driver circuit.

The load, of the ohmic-capacitive type and designated by the reference numeral 3, is driven by the output signal Tout.

The known driver circuit is not without its shortcomings.

First, in order to be able to use capacitors C1 and C2, whose capacitances are not excessively high, the connection thereof between the output terminal and the gate terminal of their corresponding final stage transistor is able to exploit the Miller effect stemming from the amplification provided by final stage transistors P1 and N1. Because it is impossible to provide precise control of the amplification of final stage transistors P1 and N1, the control over the slew rate of output signal Tout is imprecise.

In operation, when the final stage transistor P1 is on, the transistor N1 is off. Accordingly, the capacitor C2 that intervenes during the rising edge of the output signal Tout is subjected to a potential difference given by $$V2=(V+)-Vds(P1)-(V-),$$

where V2 is the voltage across capacitor C2 and Vds(P1) is the voltage between the drain terminal and the source terminal of the transistor P1.

On the contrary, in the second mode wherein the transistor P1 is in the off state and the transistor N1 in the on state, the capacitor C1 is subjected to a potential difference given by $$V1=(V+)-[(V-)+Vds(N1)],$$

where V1 is the voltage across capacitor C1 and Vds(N1) is the voltage between the drain terminal and the source terminal of the transistor N1.

In the context of the known driver being part of an RS232 serial interface, the difference in voltage between V+ and V− is high and it is therefore necessary to use high-voltage capacitors for capacitors C1 and C2. Consequently, the area occupied by the capacitors C1 and C2 in an integrated circuit chip substantially increases.

Further, the charging and discharging currents for the two capacitors C1 and C2 cannot be accurately controlled, since they are respectively coupled to the output of the positive and negative boost circuits 1 and 2.

SUMMARY OF THE INVENTION

Based upon the foregoing, the aim of the present invention is to provide a circuit for controlling the slew rate of the output of a driver in a push-pull configuration which maintains the slew rate within a predetermined interval even when the temperature varies.

The present invention provides a circuit for controlling the slew rate of the output of a driver in a push-pull configuration having reduced area with respect to known driver circuits in order to be integrated in a wide variety of applications.

The circuit controls the slope of the rising and falling transitions of the output signal of a driver independently of each other.

The circuit controls the slew rate of the output of a driver in a push-pull configuration in which the short-circuit currents can be controlled in a simple manner, thereby eliminating the need for additional circuits.

The present circuit for controlling the slew rate of the output of a driver in a push-pull configuration is relatively highly reliable and relatively easy to competitively manufacture.

This aim and others which will become apparent hereinafter are achieved by a circuit for controlling the slew rate of the output of a driver in a push-pull configuration, including a current generator for generating a pair of currents and a switching circuit which drives the current generator and is in turn driven by an input signal of the driver. The present circuit further includes at least one capacitor that is selectively charged and discharged according to the current generator so as to generate a first signal having a predetermined slew rate. The present circuit also includes a converter circuit for converting the first signal into at least one controlled current signal for driving the final stage of the driver. The resulting output signal of the driver has a slew rate which is substantially accurately controlled and is based upon the slew rate of the first signal.

BRIEF DESCRIPTION OF THE DRAWINGS

Further characteristics and advantages of the invention will become apparent from the description of a preferred embodiment of the present invention, illustrated only by way of non-limitative examples in the accompanying drawings, wherein.

DETAILED DESCRIPTION OF THE PREFERRED EMBODIMENT

Figure 2:
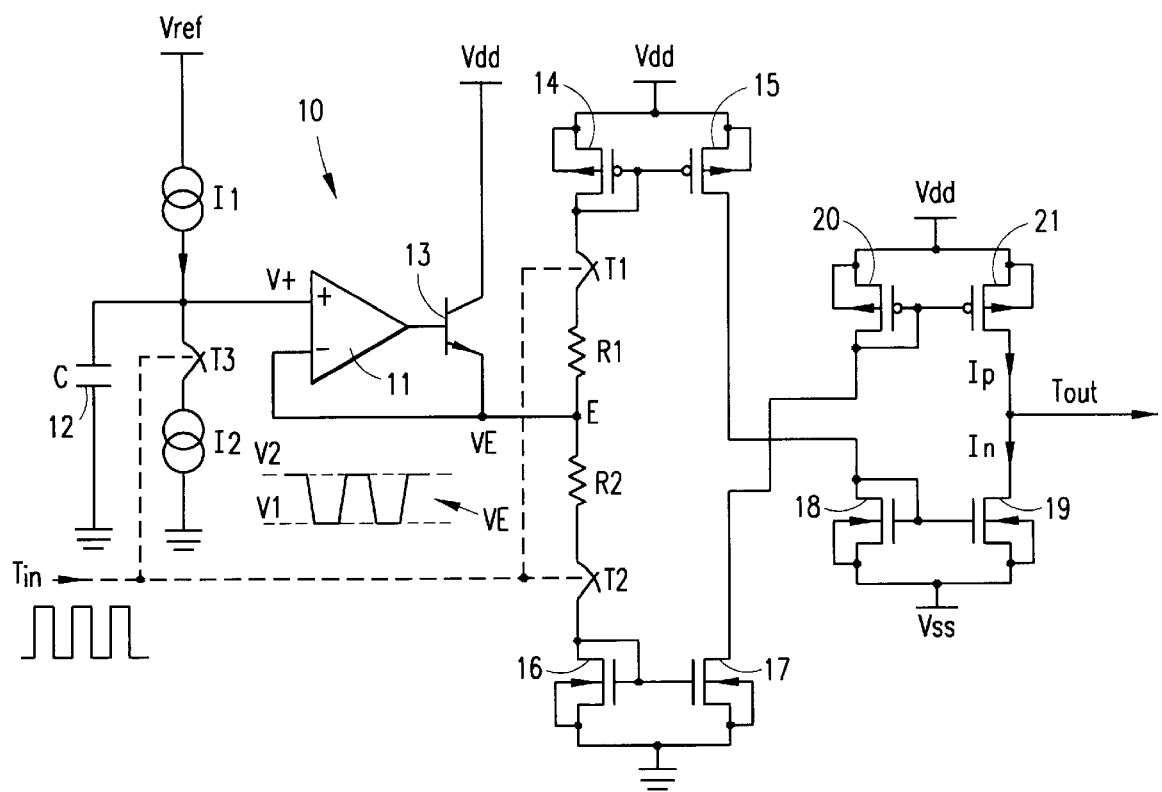
FIG. 2 is a schematic diagram of a driver according to a preferred embodiment of the present invention.

With reference to FIG. 2, there is shown the present circuit for controlling the slew rate of the output voltage signal of a driver, generally designated by the reference numeral 10, including an operational amplifier 11 of the non-inverting type and at least one capacitor 12 that is connected between the non-inverting terminal of operational amplifier 11 and ground.

Two current sources I1 and I2 are provided in circuit 10 that are series-connected between a reference voltage Vref and ground. A common node of current sources I1 and I2 is connected to the non-inverting input terminal of the operational amplifier 11.

Input signal Tin drives a switch T3, such as a field effect transistor, that is connected in series between the two current sources I1 and I2. Capacitor 12, current sources I1 and I2 and switch T3 may be viewed as a switched-capacitive circuit for generating a voltage signal having a predetermined slew rate. Input signal Tin also drives a pair of switches T1 and T2 that may be implemented, for example, using field effect transistors. The specific function of switches T1 and T2 will described in detail below.

The output of the operational amplifier 11 is connected to a bipolar transistor 13. Transistor 13 has a collector terminal that is connected to the supply voltage Vdd and an emitter terminal that is connected to the inverting input terminal of the operational amplifier 11.

Each current source I1 and I2 provides a substantially constant current level. The substantially constant current flowing through current source I2 is preferably greater than the substantially constant current flowing through current source I1.

The emitter terminal of the transistor 13 is also connected to two current mirrors which are formed respectively by P-channel field effect transistors 14 and 15 and by N-channel field effect transistors 16 and 17.

The first current mirror, formed by the transistors 14 and 15, is connected to a third current mirror formed by N-channel field effect transistors 18 and 19. The second current mirror, formed by the field effect transistors 16 and 17, is connected to a fourth current mirror formed by P-channel field effect transistors 20 and 21. Transistors 19 and 21, connected between power supply VDD and ground, form the final stage of the driver circuit having a push-pull configuration.

The emitter terminal of the bipolar transistor 13 is connected at a common node E between the first current mirror and the second current mirror. A resistor R1 and the switch T1 are series-connected between the node E and the first current mirror. A resistor R2 and the switch T2 are series-connected between the node E and the second current mirror. As mentioned, input signal Tin drives the switches T1 and T2 and thereby controls the activation thereof.

The first current mirror is connected to the supply voltage Vdd, and the second current mirror is connected to ground.

The third current mirror, formed by the transistors 18 and 19, is connected to a low reference voltage Vss. The supply voltage VDD (obtained by use of a charge pump circuit) is connected to the fourth current mirror formed by the field effect transistors 20 and 21. It is understood that supply voltage VDD may be different from supply voltage Vdd shown in FIG. 2.

The P-channel field effect transistor 21 and the N-channel field-effect transistor 19 form the final stage of the driver and generates output signal Tout. Output signal Tout drives an ohmic-capacitive load (not shown).

The operation of circuit 10 for controlling the slew rate of the output signal Tout according to the invention will be described.

Figure 1:
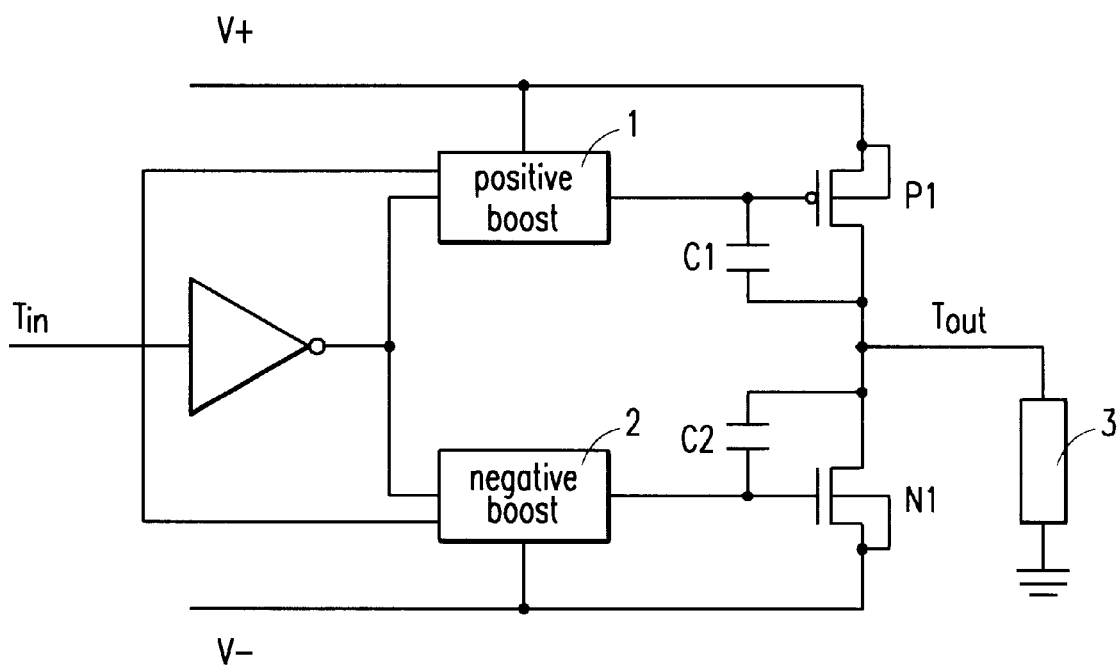
FIG. 1 is a schematic diagram of a conventional driver having a push-pull configuration.

In contrast to known driver circuits, such as the driver circuit illustrated in FIG. 1, which perform voltage-based slew rate control, circuit 10 according to the present invention converts a voltage signal having a controlled and/or predetermined slew rate into a current signal that is used to drive transistors 19 and 21 of the final stage of the driver. In this manner it is possible to obtain an output signal Tout having a substantially precisely controllable slew rate.

It is accordingly possible to obtain positive (rising) and negative (falling) edge transitions each having a controlled slope by selectively charging and discharging the capacitor 12 using current sources I1 and I2 as controlled by and/or based upon the input signal Tin.

The voltage VE appearing at the emitter terminal of the transistor 13 and/or at node E varies between two values V2 and V1. In the preferred embodiment of the present invention, the voltage levels of V2 and V1 are the supply voltage Vdd and ground, respectively. It is understood that voltage levels V1 and V2 may instead be within a range of voltages between supply voltage Vdd and ground.

Designating the value of the capacitor 12 as C for the sake of simplicity, the charging and discharging of capacitor 12 may be described mathematically. The current equation for charging of capacitor 12 may be represented as $$I1 = C*(V2-V1)/\Delta T,$$

so that the charging time of capacitor 12 may be described by the equation $$\Delta Vc/\Delta T = I1/C,$$

where $\Delta Vc$ is the voltage across capacitor 12. The current equation for discharging capacitor 12 may be represented as $$I1-I2 = C*(V2-V1)/\Delta T,$$

so that the equation for discharging capacitor 12 may be represented as $$\Delta Vc/\Delta T = (I1-I2)/C.$$

Accordingly, by choosing the capacitance value for capacitor C and the current levels for each current source I1 and I2, it is possible to adjust and/or set the slope of the edge transitions appearing on the signal at the non-inverting input terminal of operational amplifier 11. In other words, the slew rate of the signal appearing at the non-inverting input terminal of operational amplifier 11 may be set based upon the chosen capacitance value of capacitor C and the current levels of current sources I1 and I2. The slope of each edge transition appearing at node E is substantially unchanged from the slope of the corresponding edge transition appearing at the non-inverting input terminal of operational amplifier 11 by virtue of operational amplifier 11 being connected to a voltage follower formed by transistor 13.

Further, it can be seen that the charging time and discharging time for capacitor 12 may be set independently from each other. The independently controlled charge and discharge times of capacitor 12 result in the slope of the rising and falling edge transitions of the signal appearing at the non-inverting input of operational amplifier 11 to be independently controlled.

The state of switch T3 determines whether capacitor 12 is being charged or discharged. In particular, when switch T3 is closed, the charge appearing on capacitor 12 is discharged therefrom through current source I2. Alternatively, when switch T3 is open, capacitor 12 is charged from current source I1. As can be understood, the current passing through current source I2 is greater than the current passing through current source I1.

The voltage appearing across capacitor 12, whose positive (rising) and negative (falling) edge transitions have predetermined slopes, is then converted into a current signal.

The current that flows through the resistor R1, designated by $I_{R1}(t)$, is given by the following relation:

$$I_{R1}(t)=[Vdd-Vgs(14)-V_E(t)]/R1,$$

where Vgs(14) is the gate-to-source voltage of transistor 14 and $V_E(t)$ is voltage appearing at node E shown in FIG. 2.

Similarly, the current $I_{R2}(t)$ that flows across the resistor R2 is given by $$I_{R2}(t)=[V_E(t)-Vgs(16)]/R2,$$

where Vgs(16) is the gate-to-source voltage of transistor 16.

The current $I_{R1}$ is then mirrored in the current through transistor 15 of the first current mirror. Similarly, the current $I_{R2}$ is mirrored in the current through transistor 17 of the second current mirror. These current mirror currents are then mirrored at the output of the driver in order to obtain the currents $I_P$ and $I_N$. The current $I_P$ may be represented as $$I_P=I_{R2}(t)*n1*n2,$$

where n1 is the ratio of the size of transistor 17 to the size of transistor 16, and n2 is the ratio of the size of transistor 21 to the size of transistor 20. Similarly, the current $I_N$ may be represented as $$I_N=I_{R1}(t)*n3*n4,$$

where n3 is the ratio of the size of transistor 15 to the size of transistor 14, and n4 is the ratio of the size of transistor 19 to the size of transistor 18.

Figure 3:
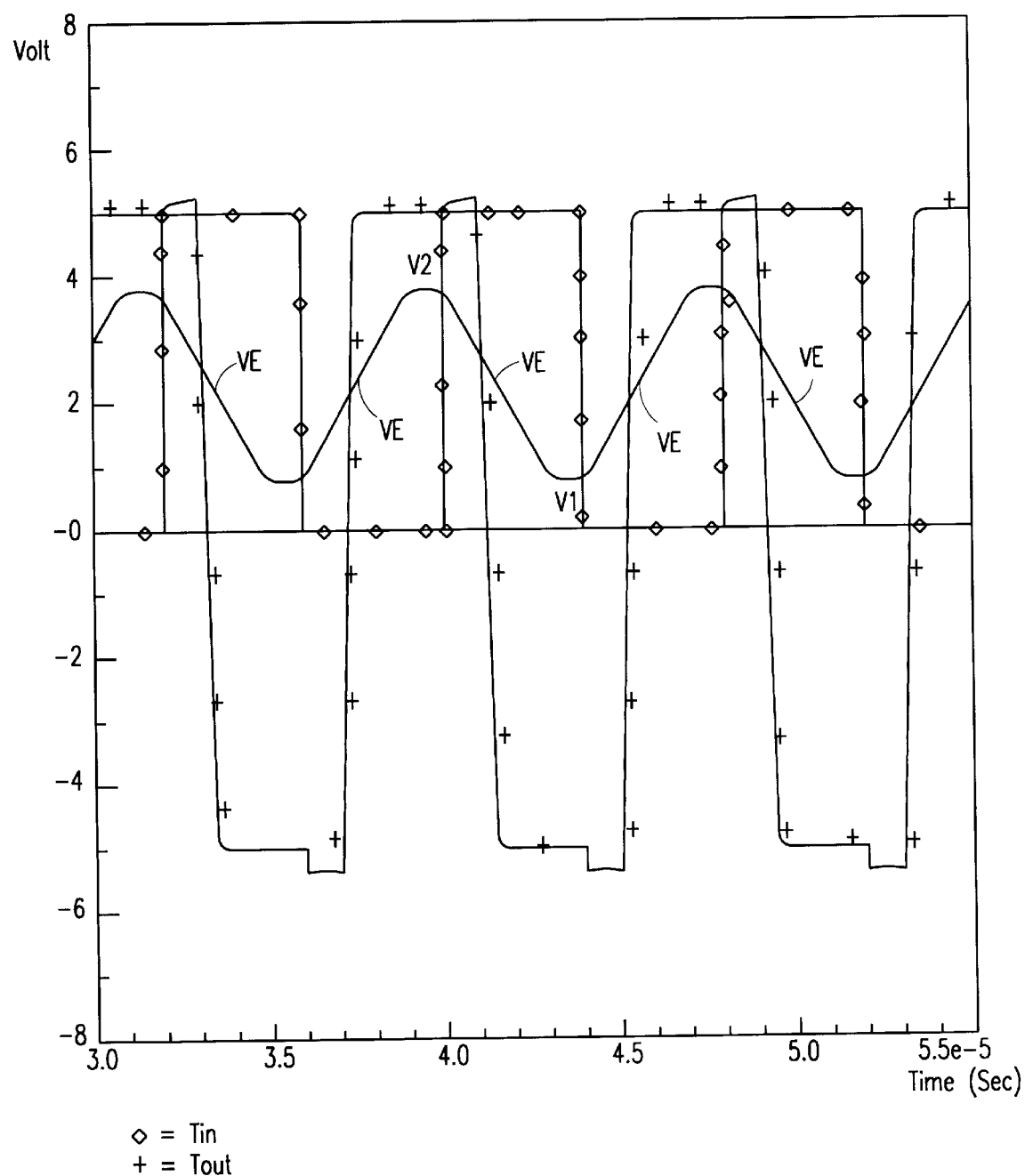
FIG. 3 illustrates the timing between various signals of the circuit shown in FIG. 2.

The switches T1 and T2 are driven by the input signal Tin such that when input signal Tin is at the higher voltage level to turn on switch T3, switch T1 is also turned on and switch T2 is turned off, which causes current to flow through the first current mirror (transistors 14 and 15) and through the third current mirror (transistors 18 and 19) so as to sink current $I_N$ and/or cause a falling transition on output signal Tout. Alternatively, when input signal Tin is at a lower voltage level and turns off switch T3, switch T1 is turned off and switch T2 is turned on, which causes current to flow through the second current mirror (transistors 16 and 17) and the fourth current mirror (transistors 20 and 21) so as to source current $I_P$ and/or cause a controlled rising edge transition on output signal Tout having a controlled slope. FIG. 3 illustrates the timing waveforms for input signal Tin, intermediate signal $V_E$, and output signal Tout. In FIG. 3, the charge and discharge times for capacitor 12 are set to be roughly the same.

The present circuit produces substantially tight control of the slew rate of output signal Tout without loads or in conditions involving small load capacitances, such as data transmission over coaxial cables in an RS232 interface application.

Moreover, the control of the slew rate by the present invention occurs mostly in the initial portions of the edge transitions due to the variation of the voltage $V_E$ between the two levels V1 and V2.

Since the transistors in the final stage of the driver circuit, p-channel field-effect transistor 21 and n-channel field-effect transistor 19, have the intrinsic technology-dependent characteristic of having different capacitances between their respective gate and source terminals, it is necessary to be able to independently control the slope of the output current edge transitions in order to obtain substantially the same rise and fall times for the output voltage Tout. This is achieved by keeping unchanged the value of the capacitor 12 and by varying only the currents I1 and I2.

For very large load capacitances, the slew rate is instead linked to the capacitive value of the load and to the short-circuit currents that can be controlled by selecting the dimensions of the current mirrors and of IR1 and IR2. This is because the variation in the voltage VE from the level V1 to the level V2 occurs in a much shorter period of time relative to the time the output signal Tout transitions from the value VSS to VDD.

In practice it has been observed that the circuit 10 according to the present invention allows for substantially tight control of the slew rate of the output signal Tout using parameters which can be modified easily and are highly precise.

Another advantage of the circuit 10 according to the invention is the fact that it is possible to control the short-circuit current very easily, thus eliminating the drawbacks arising from the use of additional circuits for controlling the short-circuit current.

Additionally, the use of a single capacitor 12 for controlling slew rate results in a reduced area on an integrated circuit chip relative to known solutions, thereby allowing better integration of circuit 10 in existing applications.

It is understood that circuit 10 is adapted for use not only in an RS232 interface but also in applications where it is necessary to drive the final stage of a driver having field-effect transistors in a push-pull configuration.

The circuit thus conceived is susceptible of numerous modifications and variations, all of which are within the scope of the inventive concept. It is understood that the components of circuit 10 may be replaced with other technically equivalent elements. It is also understood that the components of circuit 10 may have a wide variety of values and/or dimensions, so long as they are compatible with the specific operation described above.

What is claimed is:

1. A control circuit for controlling the slew rate of the output voltage of a driver circuit having a push-pull configuration including a pull-up transistor and a pull-down transistor, comprising:

a capacitive element;

a current generator circuit, connected to the capacitive element, for generating one or more currents;

a first switching circuit, connected to the current generator circuit and the capacitive element, for selectively controlling the charging and discharging of the capacitive element responsive to an input signal so that rising and falling edge transitions of a voltage signal appearing across the capacitive element each has a predetermined slope; and a conversion circuit for converting the voltage signal into a plurality of current signals, the current signals being used to control the pull-up and pull-down transistors of the driver circuit so that a slope of an edge transition of the output voltage thereof is based upon a predetermined slope of an edge transition of the voltage signal appearing across the capacitive element.

2. The control circuit according to claim 1, wherein:

the current generator circuit comprises a first current source connected to the capacitive element for charging the capacitive element, and a second current source selectively coupled to the capacitive element through the first switching circuit for discharging the capacitive element; and the control circuit further comprises an amplifier circuit connected to the capacitive element for amplifying the voltage signal, the amplified voltage signal being coupled to the conversion circuit.

3. The control circuit according to claim 2, further comprising:

a bipolar transistor having a base terminal connected to the output of the amplifier circuit and an emitter terminal that is connected to an inverting terminal of the amplifier circuit and an input to the conversion circuit.

4. The control circuit according to claim 3, wherein:

a slope of each of the rising and falling edge transitions of the voltage signal appearing at the emitter terminal of the bipolar transistor substantially matches the corresponding slope of the rising and falling edge transitions of the voltage signal appearing across the capacitive element.

5. The control circuit according to claim 1, wherein the conversion circuit comprises:

a first current mirror selectively enabled by the input signal and coupled to the voltage signal appearing across the capacitive element, for generating a first current, the first current being used to control the pull-down transistor of the driver circuit; and a second current mirror selectively enabled by the input signal and coupled to the voltage signal appearing across the capacitive element, for generating a second current, the second current being used to control the pull-up transistor of the driver circuit.

6. The control circuit according to claim 5, further comprising:

a second switching circuit and a third switching circuit respectively connected to the first and second current mirrors and controlled by the input signal, for selectively enabling the first and second current mirrors.

7. The control circuit according to claim 5, wherein:

the first current mirror comprises a plurality of first pull-up transistors; and the second current mirror comprises a plurality of first pull-down transistors.

8. The control circuit according to claim 5, further comprising:

a second pull-up transistor connected to the pull-up transistor of the driver circuit so as to form a third current mirror connected to the second current mirror; and a second pull-down transistor connected to the pull-down transistor of the driver circuit so as to form a fourth current mirror connected to the first current mirror.

9. The control circuit according to claim 8, wherein:

the first current mirror is connected to the supply voltage and the second current mirror is connected to a ground reference; and the third current mirror and the fourth current mirror are connected, respectively, to a voltage level generated by a charge pump circuit and to a corresponding complementary voltage level.

10. The control circuit according to claim 8, wherein:

the first current mirror provides a current to the second pull-down transistor that is mirrored in the pull-down transistor of the driver circuit; and the second current mirror provides a current to the second pull-up transistor that is mirrored in the pull-up transistor of the driver circuit.

11. The control circuit according to claim 1, wherein:

the slope of each of the rising and falling edge transitions of the voltage signal appearing across the capacitive element is based upon a capacitance value of the capacitive element and a current level of a current generated by the current generator circuit.

12. A driver circuit, comprising:

a capacitive-switched circuit for generating a first voltage signal whose edge transitions have at least one predetermined slope;

a final stage circuit comprising a pull-up device and a pull-down device connected in a push-pull configuration and generating an output voltage; and a converting circuit, connected between the capacitive-switched circuit and the final stage circuit, for converting the first voltage signal into a first control signal for controlling the activation of the pull-up device and a second control signal for controlling the activation of the pull-down device, a slope of at least one edge transition of the output voltage of the final stage circuit is based upon the at least one predetermined slope of the edge transitions of the first voltage signal.

13. The driver circuit of claim 12, wherein the switched-capacitive circuit comprises:

a capacitor;

at least one current source connected to the capacitor; and a switch connected to the capacitor, the switch being activated by the input signal to selectively charge and discharge the capacitor, the first voltage signal comprising a voltage appearing across the capacitor.

14. The driver circuit of claim 13, wherein:

a slope of a rising edge transition of the first voltage signal is based upon a capacitance value of the capacitor and a current level flowing through the at least one current source.

15. The driver circuit of claim 13, wherein the switched-capacitive circuit further comprises:

a second current source coupled to the capacitor through the switch, activation of the switch discharges the capacitor through the second current source, a slope of a falling edge transition of the first voltage signal being based upon a capacitance value of the capacitor and a current level flowing through the second current source.

16. The driver circuit of claim 15, wherein:

each of the first and second current sources generates a substantially constant current, the current level flowing through the first current source is different from the current level flowing through the second current source.

17. The driver circuit of claim 12, wherein the converting circuit comprises:

a first current mirror having an input leg coupled to the first voltage signal and generating a mirrored current that controls the operation of the pull-down device of the final stage circuit, the mirrored current being the second control signal.

18. The driver circuit of claim 17, wherein the converting circuit further comprises:

a pull-down device connected to the pull-down device of the final stage circuit so as to form a current mirror therewith, the pull-down device being connected to the first current mirror so as to receive a current therefrom, the current received from the first current mirror being mirrored in the pull-down device of the final stage circuit.

19. The driver circuit of claim 17, wherein the converting circuit further comprises:
a switch connected between the first current mirror and the capacitive-switched circuit and enabled by the input signal of the driver circuit.

20. The driver circuit of claim 12, wherein the converting circuit comprises:
a first current mirror having an input leg coupled to the first voltage signal and generating a mirrored current that controls the operation of the pull-up device of the final stage circuit, the mirrored current being the first control signal.

21. The driver circuit of claim 20, wherein the converting circuit further comprises:
a pull-up device connected to the pull-up device of the final stage circuit so as to form a current mirror therewith, the pull-up device being connected to the first current mirror so as to receive a current therefrom, the current received from the first current mirror being mirrored in the pull-up device of the final stage circuit.

22. The driver circuit of claim 20, wherein the converting circuit further comprises:
a switch connected between the first current mirror and the capacitive-switched circuit and enabled by the input signal of the driver circuit.

23. The circuit of claim 12, wherein:
a slope of a rising edge transition and a slope of a falling edge transition of the first voltage signal are independently controlled.

24. A method of controlling a driver circuit in a push-pull configuration including a pull-up transistor and a pull-down transistor, comprising the steps of:
generating a first voltage signal from an input signal having a predetermined slew rate; and
generating a pair of control signals based upon the first voltage signal, a first control signal of the pair of control signals controlling the operation of the pull-down transistor of the driver circuit and a second control signal of the pair of control signals controlling the operation of the pull-up transistor of the driver circuit, the first control signal and the second control signal respectively controlling the pull-up transistor and the pull-down transistor of the driver so that a slew rate thereof is based upon the slew rate of the first voltage signal.

* * * * *

UNITED STATES PATENT AND TRADEMARK OFFICE
CERTIFICATE OF CORRECTION

PATENT NO. : 6,194,935 B1
DATED : February 27, 2001
INVENTOR(S) : Sergio Franco Pioppo et al.

Page 1 of 1

It is certified that error appears in the above-identified patent and that said Letters Patent is hereby corrected as shown below:

<u>Title page,</u>
Item [56], insert -- [30] Foreign Application Priority Data Nov. 10, 1998 [EP] European Pat. Off. 98830679.1 --

Signed and Sealed this

Thirteenth Day of November, 2001

Attest:

*Nicholas P. Godici*

NICHOLAS P. GODICI
*Attesting Officer*    *Acting Director of the United States Patent and Trademark Office*